US008966730B1

(12) United States Patent
Carralero et al.

(10) Patent No.: US 8,966,730 B1
(45) Date of Patent: Mar. 3, 2015

(54) METHOD OF MANUFACTURING A SENSOR NETWORK INCORPORATING STRETCHABLE SILICON

(75) Inventors: Michael Alexander Carralero, Huntington Beach, CA (US); John Lyle Vian, Renton, WA (US)

(73) Assignee: The Boeing Company, Chicago, IL (US)

( * ) Notice: Subject to any disclaimer, the term of this patent is extended or adjusted under 35 U.S.C. 154(b) by 995 days.

(21) Appl. No.: 13/084,729

(22) Filed: Apr. 12, 2011

Related U.S. Application Data

(62) Division of application No. 12/389,196, filed on Feb. 19, 2009, now Pat. No. 7,948,147.

(51) Int. Cl.
| | |
|---|---|
| *H01L 41/04* | (2006.01) |
| *H01L 41/25* | (2013.01) |
| *H01L 41/29* | (2013.01) |
| *B82Y 40/00* | (2011.01) |
| *G01M 5/00* | (2006.01) |
| *B82B 3/00* | (2006.01) |
| *H01L 41/08* | (2006.01) |
| *H01L 21/02* | (2006.01) |
| *B82Y 30/00* | (2011.01) |
| *B82Y 10/00* | (2011.01) |

(52) U.S. Cl.
CPC ............... *G01M 5/00* (2013.01); *B82B 3/0014* (2013.01); *H01L 41/04* (2013.01); *H01L 41/08* (2013.01); *H01L 21/02603* (2013.01); *B82Y 30/00* (2013.01); *B82Y 40/00* (2013.01); *B82Y 10/00* (2013.01); *Y10S 977/762* (2013.01); *Y10S 977/882* (2013.01); *Y10S 977/932* (2013.01); *Y10S 977/948* (2013.01)

USPC ................ 29/25.35; 29/829; 29/842; 29/594; 29/595; 977/762; 977/882; 977/932; 977/948

(58) Field of Classification Search
CPC ......... G01M 5/00; H01L 41/01; H01L 41/08; H01L 21/02603; B82Y 40/00; B82Y 10/00; B82Y 30/00; B82B 3/0014
USPC ................ 29/25.35, 842, 846, 594, 595, 829; 977/701, 762, 882, 932, 948; 310/311, 310/328, 330, 331, 332, 339
See application file for complete search history.

(56) References Cited

U.S. PATENT DOCUMENTS

| 4,849,668 | A | | 7/1989 | Crawley et al. | |
|---|---|---|---|---|---|
| 6,831,017 | B1 | * | 12/2004 | Li et al. ..................... | 977/762 X |

(Continued)

FOREIGN PATENT DOCUMENTS

| JP | 2006089326 A | * | 4/2006 |
|---|---|---|---|
| WO | 2008156606 A2 | | 12/2008 |

OTHER PUBLICATIONS

International Search Report and Written Opinion of PCT/US20101020301; May 10, 2010; 16 pages.

(Continued)

*Primary Examiner* — A. Dexter Tugbang
(74) *Attorney, Agent, or Firm* — Armstrong Teasdale LLP

(57) ABSTRACT

A method of manufacturing a sensor network is described which includes stretching a silicon substrate over a desired area, and generating a plurality of nodes fabricated on the stretchable silicon substrate. The nodes include at least one of an energy harvesting and storage element, a communication device, a sensing device, and a processor. The nodes are interconnected via interconnecting conductors formed in the substrate.

10 Claims, 3 Drawing Sheets

(56) References Cited

U.S. PATENT DOCUMENTS

| | | | |
|---|---|---|---|
| 6,870,236 B2 | 3/2005 | Johnson | |
| 6,952,042 B2 | 10/2005 | Stratton | |
| 7,231,180 B2 | 6/2007 | Benson et al. | |
| 7,278,319 B2 | 10/2007 | Johnson | |
| 2007/0114422 A1 | 5/2007 | Berkcan et al. | |
| 2007/0125176 A1 | 6/2007 | Liu | |
| 2007/0151601 A1* | 7/2007 | Jung et al. | 977/948 X |
| 2007/0243654 A1 | 10/2007 | Stratton et al. | |
| 2008/0064125 A1 | 3/2008 | Peumans et al. | |

OTHER PUBLICATIONS

Huang, K. et al.; Stretchable Silicon Sensor Networks for Structural Health Monitoring; Proceedings of the SPIE—The International Society for Optical Engineering SPIE; Mar. 16, 2006; pp. 617412-1 thru 617412-10; vol. 6174.

Sosin, S. et al; Mesh Interconnects for Silicone Embedded Stretchable Silicon Electronics; 10th Electronics Packaging Technology Conference; 2008; pp. 230-235; IEEE Piscataway, NJ.

Zoumpoulidis, T. et al.; Process Technology of High-Aspect-Ratio Silicon Beams for Stretchable Silicon Electronics; 10th Electronics Packaging Technology Conference; 2008; pp. 361-366; IEEE Piscataway, NJ.

Chiba, S. et al; Innovative Power Generators for Energy Harvesting Using Electronics Polymer Artificial Muscles; Proceedings of the SPIE—The International Society for Optical Engineering SPIE; Mar. 27, 2008; pp. 692715-1 thru 692715-9; vol. 6927.

* cited by examiner

METHOD OF MANUFACTURING A SENSOR NETWORK INCORPORATING STRETCHABLE SILICON

CROSS-REFERENCE TO RELATED APPLICATIONS

This application is a divisional application of U.S. patent application Ser. No. 12/389,196, filed Feb. 19, 2009, now U.S. Pat. No. 7,498,147, entitled "SENSOR NETWORK INCORPORATING STRETCHABLE SILICON", the disclosure of which is hereby incorporated herein by reference in its entirety.

BACKGROUND

The field of the disclosure relates generally to sensor networks, and more specifically, to methods and systems relating to sensor networks that incorporate stretchable silicon.

Existing solutions for monitoring, for example, the structural health of large areas, include interconnecting networks of sensors based on electrically conductive wires and optically conductive fibers. While fiber optic communications enables low power devices in certain communications systems, it does not enable addressing of an array of sensors without the complexity of interconnections among network nodes. Other considerations include manufacturability, mechanical connection of input/output signals, scalability, cost and reliability of wiring/fiber-optic harnesses, power busses, and data busses.

BRIEF DESCRIPTION

In one embodiment, a sensor network is provided that includes a stretchable silicon substrate and a plurality of nodes fabricated on the stretchable silicon substrate. The nodes include at least one each of an energy harvesting and storage element, a communication device, a sensing device, and a processor. The nodes are interconnected via interconnecting conductors.

In another embodiment, a method for fabricating a network is provided. The method includes stretching a silicon medium over a desired area, processing the stretched silicon medium to generate a number of nodes thereon, and utilizing conductive paths within the stretchable medium to redundantly interconnect the generated nodes to form the network.

In still another embodiment, a network for monitoring a structure is provided. The network includes a stretchable silicon substrate, a plurality of sensors fabricated on the stretchable silicon substrate, at least one communication device fabricated on the stretchable silicon substrate, and at least one energy harvesting and storage element fabricated on the stretchable silicon substrate. The stretchable silicon substrate includes a plurality of conductive paths therein that interconnect the plurality of sensors, the at least one communication device, and the at least one energy harvesting and storage element. The network is configured for attachment across a structure, dispersing the sensors. Data from the sensors is communicated to an external device via the at least one communication device.

DETAILED DESCRIPTION

Figure 1:
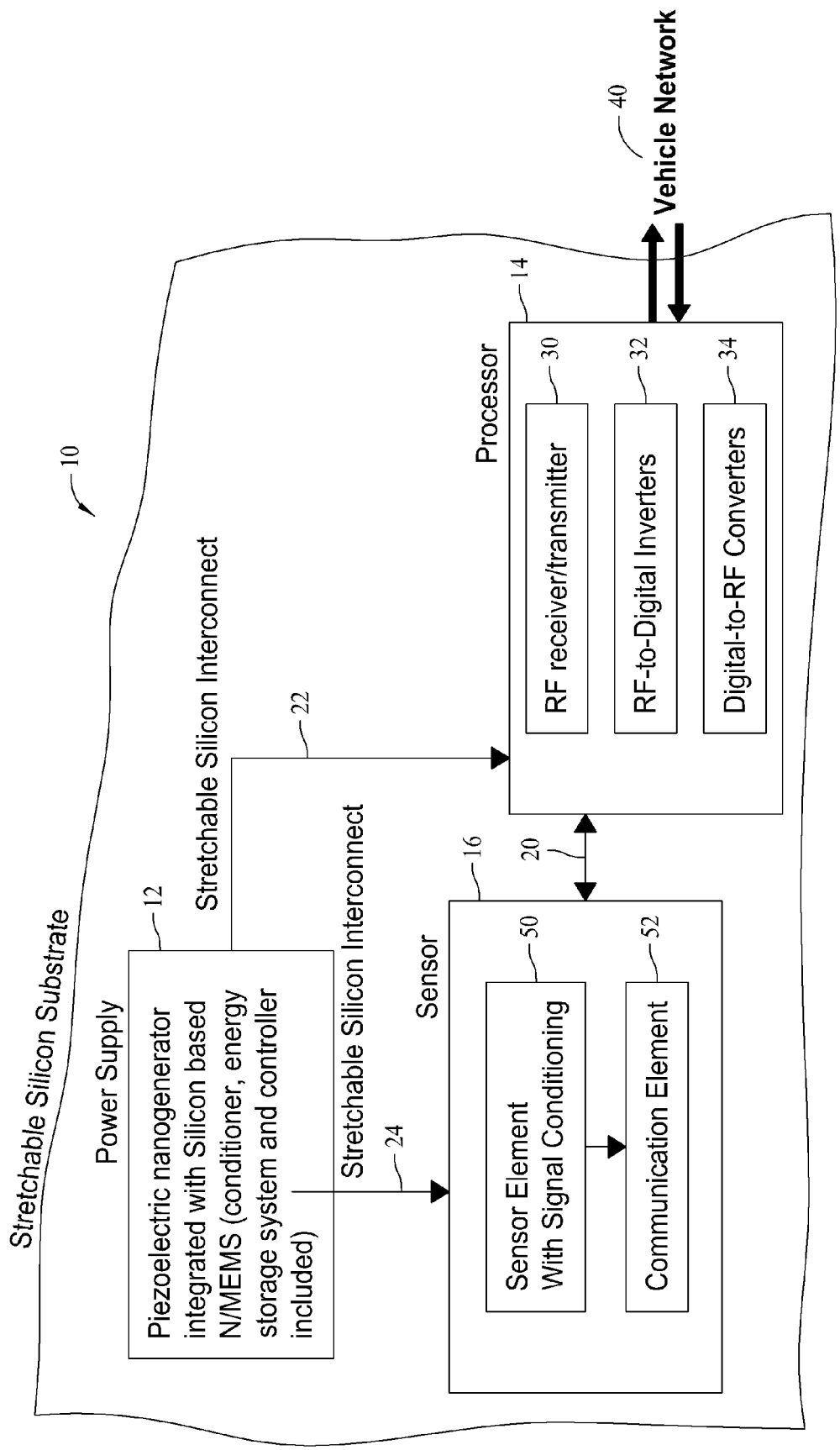
FIG. 1 is a system block diagram illustrating a sensor network fabricated using stretchable silicon in an advantageous embodiment.

FIG. 1 is a block diagram of a sensor network 10 that is based on stretchable silicon. In the illustrated embodiment, three nodes have been fabricated on a stretchable silicon substrate. The three nodes include a power supply node 12, a processor node 14, and a sensor node 16. The nodes are interconnected via interconnecting conductors 20, 22, and 24 formed in the stretchable silicon substrate.

In one embodiment, the power supply node 12 may be an energy harvesting and storage element. For example, power supply node may be a piezo-electric generator that is integrated with silicon-based Nano/Micro-Electromechanical Systems (N/MEMS) In this embodiment, the combination is able to generate and store electrical power. The power supply node 12 may provide such power to both the processor node 14 and the sensor node 16. In other embodiments, a plurality of power supply nodes 12 may be distributed across the stretchable silicon substrate providing power to nodes hosting such processing, sensing, or communication functions.

The processor node 14 includes a processing function and may include an RF receiver and transmitter 30 for communicating with portions of the sensor node 16 that are capable of communicating wireless methods. The processor node 14 may further include processing capabilities for communicating via a digital vehicle network interface 40, for example. The embodiment of FIG. 1 may include an RF-to digital inverter 32 and a digital-to-RF converter 34 facilitating communications between the vehicle network 40 and the sensor node 16 via the RF receiver/transmitter 30. The processor node 14 may be configured to manage and monitor the behavior of sensor network 10, including power generation and consumption, data acquisition, and communications both within the sensor network 10 and with external devices such as vehicle network 40.

The sensor node 16, may have a wireless operating capability, though alternative embodiments are operable through wired operating capabilities. In both configurations, the sensor node 16 includes a sensor element 50 and a communication element 52. The sensor element 50 may include integrally formed signal conditioning circuitry or signal conditioning circuitry may be physically separated from the sensor element.

The sensor node 16 as shown in FIG. 1 is configured for wireless operation, similar to the processor node 14 described above. However, embodiments are contemplated where the stretchable silicon medium is utilized as a communications interconnect between the sensor node 16 and the processor node 14, as shown by the stretchable silicon interconnect 20. Stretchable silicon interconnect 22 is utilized in the illustrated embodiment to provide the power to the processor node 14 from the power supply node 12, while the stretchable silicon interconnect 24 is utilized in the illustrated embodiment to provide the power to the sensor node 14 from the power supply node 12.

Figure 2:
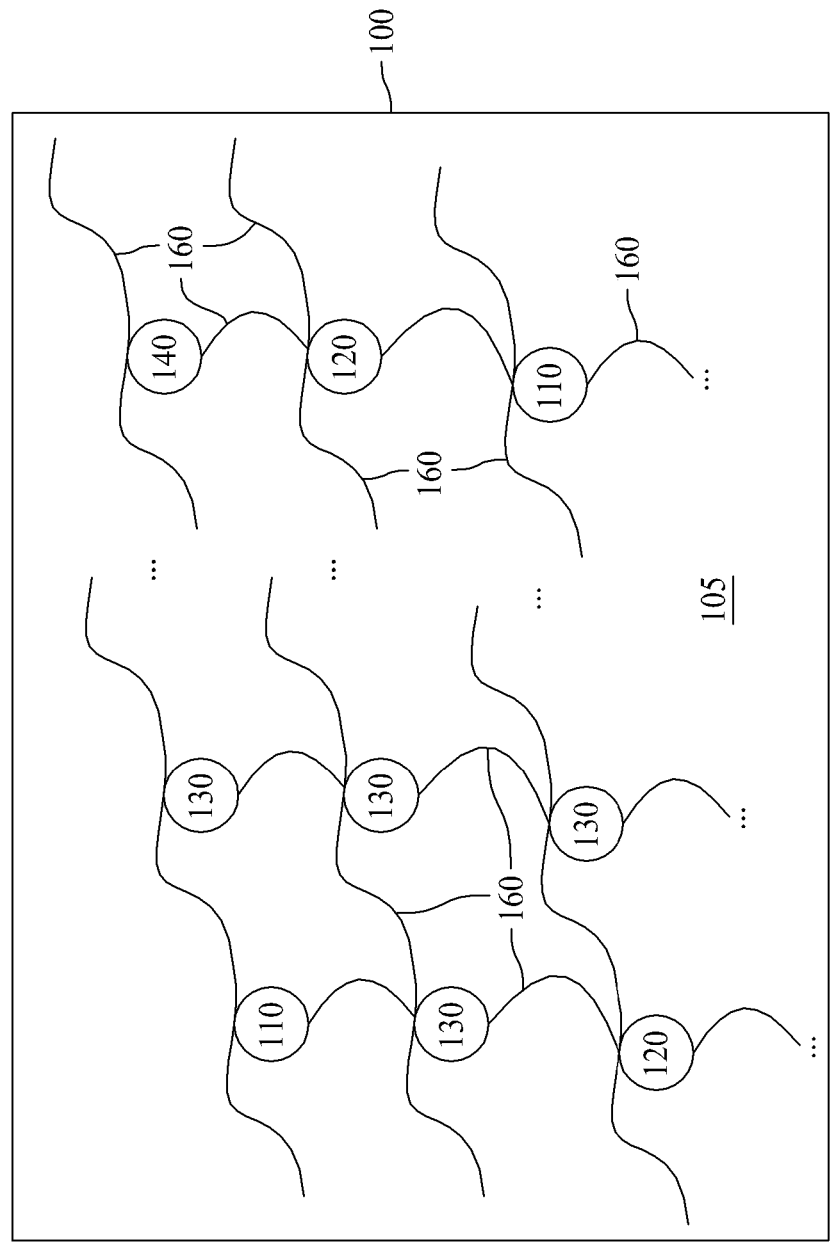
FIG. 2 is a diagram illustrating a sensor network in another advantageous embodiment, that includes stretchable silicon interconnecting energy harvesting and storage elements, wireless and wired communication devices, micro-sensors, and network management processors.

FIG. 2 is an illustration of a sensor network 100 fabricated using stretchable silicon 105. In the illustrated embodiment, the network 100 includes a plurality of components that have been fabricated on the stretchable silicon 105. The components include, for example, energy harvesting and storage elements 110, communication devices 120, sensors 130, and network management processors 140. The communications devices 120 may include both wireless and wired devices. As described herein, the plurality of components are integrated on a medium of stretchable silicon 105, which provides multiple conductive paths 160 (interconnects) formed therein which provide, for example, conduction of electrical power from the energy harvesting and storage elements 110 to the communication devices 120, sensors 130, and network management processors 140.

The conductive paths 160 also provide for at least some of the communications between the above listed components. As described further herein, and in one embodiment, the stretchable silicon 105 forms a portion of an autonomous network of wireless sensors. A high reliability results due to the redundancy built into the network 100 with stretchable silicon interconnects 160. As such, the network 100 may utilize use alternative paths between the various network components to achieve reliable communications between the sensors 130 and the existing vehicle communication network. As the illustrated network 100 has its own power source, energy harvesting and storage elements 110, the addition of such a network does not tax vehicle power systems.

The stretchable silicon medium 105 is an excellent enabler because every node formed thereon can be converted into a component that provides a desired function. Examples include a processor function and miniature sensor nodes. In one embodiment, the nodes have a size of about 200 micrometers. In one embodiment, the stretchable silicon medium 105 is processed from a foundry-processed, monolithic silicon die, of a size between one centimeter and twenty centimeters and stretched over a larger area. The process results in a plurality of robust conductors that run between the various nodes that are fabricated on the medium 105.

Network 100 resolves at least some of the prior problems that have been associated with weight and supportability of energy storage devices, complexity of interconnections among network nodes, manufacturability, mechanical connection of input/output signals, and scalability. More specifically, a system incorporating network 100 enables networked sensor coverage of large areas with multiple applications. One such application involves monitoring structural health of a structure where a plurality of the above mentioned sensors provide data to a processing element which can be queried by an external system. Other applications include the monitoring of air flow over aerodynamic surfaces utilizing applicable sensors fabricated on medium 105 and the monitoring of ice accretion and other hazardous conditions that may be encountered with the use of an aerospace structure.

Turning now to the individual components of network 100, energy harvesting and storage elements 110 provide power to the other elements of network 100. In one embodiment, a nano-piezoelectric generator effect is utilized within element 110 to convert mechanical stress into electrical current or voltage for powering the other components of network 100, including any sensors that may be fabricated on the medium 105. In one specific embodiment, zinc oxide (ZnO) nanowires are utilized in network 100. These ZnO nanowires are grown using chemical synthesis on a substrate with any curvature and materials nature. These ZnO nanowire generators produce power on the order of milliwatts in an area that is about one square millimeter.

A power output associated with such energy harvesting and storage elements 110 proportionally increases as the nanowire substrate area is expanded. Also, these devices are easily integrated with stretchable silicon based nano/micro electronics devices to develop robust Nano/Micro-Electro-Mechanical Systems (N/MEMS). In certain embodiments, the energy harvesting nodes of elements 110 incorporate capacitance-based or other energy storage components to meet the energy demands of the network 100.

In regard to the communication devices 120, at least one embodiment incorporates wireless transceiver nodes allowing data to be transmitted to and from the network 100. Such embodiments are referred to as single chip transceivers based on silicon systems. One embodiment incorporates the stretchable silicon in the fabrication of transceiver integrated circuits including the development of RF and baseband components of wireless transceivers on a single die. Wireless transceiver nodes can be directly connected to external devices.

Silicon offers a high level of integration and a low cost which is desirable for large scale manufacture, and also has the potential of reducing the power consumption. Lower power consumption allows for cheaper packaging materials such as plastic which greatly reduces the cost of a chip. For integrated solutions using silicon, bipolar and CMOS are the most popular process technologies. Bipolar technologies offer high speed and are most commonly used in analog applications. CMOS has a lower limit frequency but offers a high level of integration which is attractive for digital applications.

The sensor nodes 130 form a network constructed with silicon based devices. In various embodiments, the sensor nodes 130 may include sensors for structural health monitoring, temperature sensors, pressure sensors, vibration sensors, ice accretion sensors, dynamic air flow separation sensors, and other sensor types. In one embodiment, the sensor nodes 130 include signal conditioning circuitry, providing an interface between the sensor nodes 130 and the communications devices 120 and/or an interface between the sensor nodes and network management processors 140. Network management processors 140 may monitor the network for active sensor nodes 130 and determine if they belong to the network. The power required by the communications device 120, sensor nodes 130 and the network management processors 140 is supplied, in various embodiments, by the energy harvesting and storage elements 110 described above.

Figure 3:
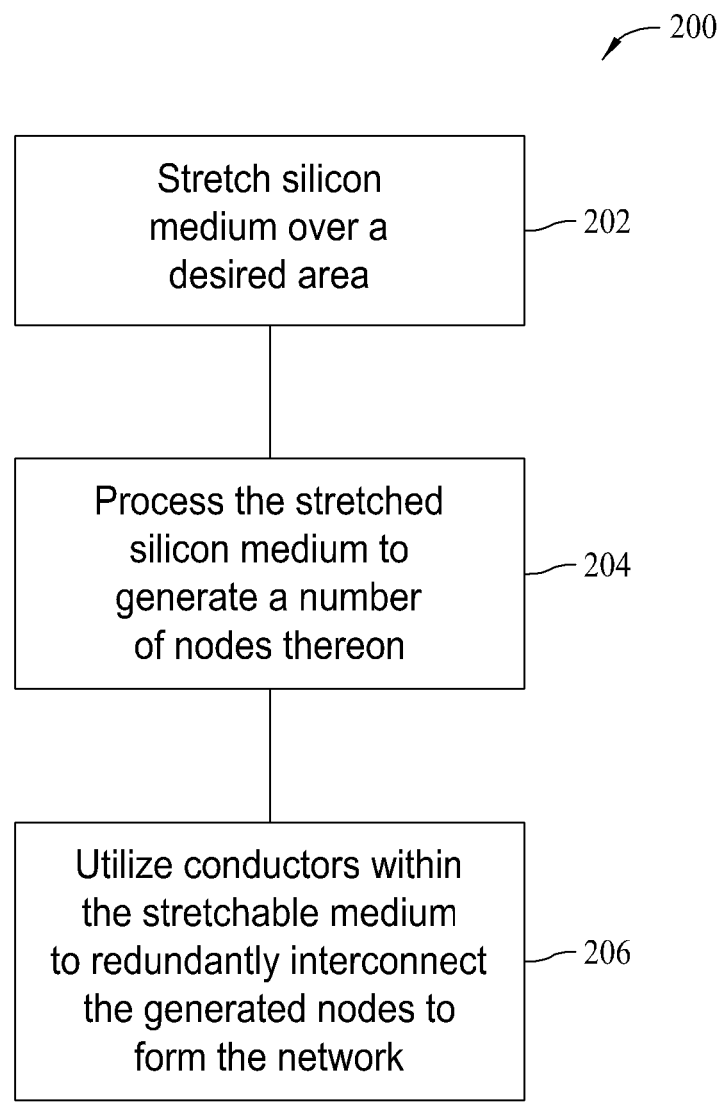
FIG. 3 is a flowchart illustrating a method for fabricating a sensor network using stretchable silicon in another advantageous embodiment.

FIG. 3 is a flowchart 200 further illustrating a method for fabricating a sensor network such as those described herein incorporating stretchable silicon. The method illustrated in the flowchart 200 includes stretching 202 a silicon medium over a desired area, processing 204 the stretched silicon medium to generate a number of nodes thereon, and utilizing 206 conductors within the stretchable medium to redundantly interconnect the generated nodes to form the network.

As further described herein, processing 204 the stretched silicon medium may include generating one or more of an energy harvesting and storage element, a communication device, a sensing device, and a processor, while utilizing 206 conductors within the stretchable medium may include routing power from energy harvesting and storage elements to the various communication devices, sensing devices, and processors.

Processing 204 the stretched silicon medium, in one embodiment, includes generating at least one communications device with a wireless communications capability. In another embodiment, processing 204 the stretched silicon medium includes generating at least one processor capable of communicating with an external network. As further described herein, the method described by flowchart 200 is useful for multiple applications, and therefore, processing 204 the stretched silicon medium may include, but is not limited to, generating sensors for structural health monitoring and management, generating ice accretion sensors, and generating sensors configured for sensing dynamic flow separation of the air surrounding the sensor.

Various embodiments described herein may be used for structural health monitoring and management, for example, of aircraft and other vehicles. In such applications, the stretchable silicon substrate is capable of being stretched out, for example, up to 100 times its original size. In the structural health application, such a substrate may be attached across a relevant portion of the structure. In the configuration, sensors are able to sense changes in the environment, provide data to network processors such as network management processors 140 which in turn utilize communications devices 120 to communicate the sensor data to an external system. Examples of applications outside of structural health monitoring include dynamic flow separation of the surrounding air, and the monitoring of ice accretion on structures.

The autonomous network of wireless sensors described herein accommodates the rigorous configuration control demands of aerospace applications and enhances sensor designs and construction methods suitable for installation in hostile environments. A wide range of temperature sensors, pressure sensors and flow sensors for harsh and demanding environments can be utilized in aircraft and aero engines where unique applications are desired. Also, the described network has the capability of incorporating advanced data systems architectures that are necessary to communicate, store and process massive amounts of health management data from large numbers of diverse sensors.

In one example, network 100 can be configured to perform as a portion of an Integrated Vehicle Health Management (IVHM) system that will provide real-time knowledge of structural, propulsion, thermal protection and other critical systems for optimal vehicle management and mission control. In such systems, on-board, real-time sensing systems are a critical component of a vehicle health management system. To provide such capability, network 100 includes sensors that have an ability to withstand harsh aerospace operating environments, while also having minimal size, weight, and power requirements.

This written description uses examples to disclose various embodiments, including the best mode, and also to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for fabricating a network comprising:
   stretching a silicon medium over a desired area;
   processing the stretched silicon medium to generate a number of nodes thereon, at least a first portion of the nodes including an energy harvesting and storage element having zinc oxide nanowires grown on the silicon medium, at least a second portion of the nodes including at least one of a communication device, a sensing device, and a processor; and
   utilizing conductors within the stretchable silicon medium to redundantly interconnect the generated nodes to form the network.

2. A method according to claim 1 wherein utilizing conductors within the stretchable medium comprises routing power from the energy harvesting and storage element to the at least one of the communication device, the sensing device, and the processor.

3. A method according to claim 1 wherein processing the stretched silicon medium comprises generating the at least one communication device with a wireless communications capability.

4. A method according to claim 1 wherein processing the stretched silicon medium comprises generating the at least one processor capable of communicating with an external network.

5. A method according to claim 1 wherein processing the stretched silicon medium comprises generating at least one of a sensor for structural health monitoring and management, an ice accretion sensor, and a sensor configured for sensing dynamic flow separation of the air surrounding the sensor.

6. A method according to claim 1 wherein processing the stretched silicon medium comprises fabricating piezo-electric devices that convert mechanical stress into electrical energy as the energy harvesting and storage element.

7. A method according to claim 1 wherein processing the stretched silicon medium comprises generating the communication device that includes an RF transceiver.

8. A method according to claim 1 wherein processing the stretched silicon medium comprises generating the communication device that communicates via a vehicle network interface.

9. A method according to claim 1 wherein stretching the silicon medium over the desired area comprises stretching a monolithic silicon die stretched over the desired area.

10. A method according to claim 1 wherein processing the stretched silicon medium comprises fabricating at least one of temperature sensors, pressure sensors, and vibration sensors.

* * * * *